United States Patent [19]
Wise

[11] Patent Number: 6,007,624
[45] Date of Patent: Dec. 28, 1999

[54] PROCESS FOR CONTROLLING AUTODOPING DURING EPITAXIAL SILICON DEPOSITION

[75] Inventor: Rick L. Wise, Plano, Tex.

[73] Assignee: Texas Instruments Incorporated, Dallas, Tex.

[21] Appl. No.: 08/706,364

[22] Filed: Aug. 30, 1996

[51] Int. Cl.⁶ ............................ C30B 25/16; H01L 21/31
[52] U.S. Cl. ............................ 117/96; 117/95; 117/935; 438/916; 438/902; 438/906; 438/761
[58] Field of Search ................... 117/95, 96, 935; 438/761, 764, 902, 906, 916

[56] References Cited

U.S. PATENT DOCUMENTS

| 4,579,609 | 4/1986 | Reif | 117/935 |
| 4,859,626 | 8/1989 | Wise | 437/81 |
| 4,894,349 | 1/1990 | Saito | 117/935 |

FOREIGN PATENT DOCUMENTS

| 61-141118 | 6/1986 | Japan . |
| 62-072118 | 4/1987 | Japan . |
| 62-219625 | 9/1987 | Japan . |
| 63-119222 | 5/1988 | Japan . |
| 63-169722 | 7/1988 | Japan . |

OTHER PUBLICATIONS

"VLSI Quality Silicon Epitaxial Growth at 850° C.", V.J. Silvestri, K. Nummy, P. Ronsheim, R. Bendernagal, D. Kerr and V. T. Phan; Journal Electrochem. Soc., vol. 137, No. 7, Jul. 1990, pp. 2323–2327.

Symposium B on Photon, Beam and Plasma Assisted Processing Fundamentals and Device Technology of the 1988 E–MRS Spring Conference, Strasbourg, France, May 31–Jun. 2, 1988, vol. 36, ISSN 0169–4332, Applied Surface Science, 1989, Netherlands, pp. 673–680, XP000609298, Regolini J. L. et al., "Characterization of Epitaxial Silicon Layers Made by Reduced Pressure/Temperature CVD."

IBM Technical Disclosure Bulletin, vol. 20, No. 3, Aug. 1977, New York, US, pp. 1083–1084, XP002019125, Anonymous Author, "Prevention of Autodoping During Silicon Epitaxial Deposition", Aug. 1977.

*Primary Examiner*—Robert Kunemund
*Assistant Examiner*—Evelyn Defilló
*Attorney, Agent, or Firm*—Jacqueline J. Garner; W. James Brady, III; Richard L. Donaldson

[57] ABSTRACT

A method for controlling the autodoping during epitaxial silicon deposition. First, the substrate (10) is cleaned to remove any native oxide. After being cleaned, the substrate (10) is transferred to the deposition chamber in an inert or vacuum atmosphere to inhibit the growth of a native oxide on the surface of the wafers. A lower temperature (i.e., 500–850° C.) capping layer (14) is deposited to prevent autodoping. Then, the temperature is increased to the desired deposition temperature and the remainder of the epitaxial layer (18) is deposited.

18 Claims, 4 Drawing Sheets

PROCESS FOR CONTROLLING AUTODOPING DURING EPITAXIAL SILICON DEPOSITION

FIELD OF THE INVENTION

This invention generally relates to semiconductor processing and more specifically to epitaxial silicon deposition.

BACKGROUND OF THE INVENTION

An integral part of bipolar and BiCMOS integrated circuits is an epitaxial layer which serves as the collector and provides a highly ordered crystalline layer into which subsequent diffusions and implants of dopants can be made during the device fabrication. A buried collector is diffused or implanted into patterned areas of the substrate before the epitaxial layer is formed. For fabrication of NPN transistors, lightly-doped n-type (or intrinsic) epitaxial silicon is deposited above the heavily doped n-type buried layer (subcollector). The dopant concentration in the buried layer is typically about 3–5 orders of magnitude higher than in the epitaxial layer.

In the limiting case of RF circuits for BiCMOS technologies, isolation schemes are required that provide reduced collector-substrate capacitances for NPN bipolar junction transistors (BJTs) while supporting high packing density for MOS and bipolar junction transistors. The use of buried collectors with highly doped shallow junctions and reduced lateral diffusion allow lower isolation doses to support minimum device spacings. This reduced peripheral area of the buried layer results in a reduction in the peripheral component of the collector-substrate capacitance which is typically dominant in NPN transistors. In order to achieve formation of abrupt, low-resistance buried collectors, epitaxial deposition processes are needed which are capable of depositing thin (<2 um) films without significant diffusion of the dopant occurring during the deposition processes either into the substrate or into the forming epitaxial layer. It is also important to minimize loss of the buried layer dopant through evaporation during the epitaxial deposition process and to minimize the reincorporation of evaporated dopant (referred to as autodoping) either vertical or lateral to the buried layer.

Because of its higher solid solubility, arsenic (As) is the preferred dopant for the formation of the buried collector profile. However, due to a high sticking coefficient, arsenic has the disadvantage of making the epitaxial film growth process very susceptible to autodoping. Vertical autodoping effects the intrinsic collector doping and decreases collector-base breakdown voltages. Lateral autodoping compensates isolation autodoping and, in turn, degrades the trade-off between peripheral substrate capacitance and device packing density.

Conventional methods for forming an epitaxial layer use a high temperature (1150–1200° C.) pre-bake in a hydrogen ambient before epitaxial deposition. The high temperature pre-bake removes the native oxide from the surface and causes dopants from the buried layer to outgas and evaporate into the gas ambient above the wafer surface or become mobile atoms absorbed to the wafer surface. Although lower temperatures can be used to effectively rid the surface of native oxide, the sticking coefficient if the arsenic atoms increases with decreasing temperature and can result in severe vertical and lateral autodoping profiles. For this reason, a high temperature pre-bake is typically used to remove the surface oxide and evaporate some of the arsenic from the surface while it exhibits lower propensity to stick to the surface. Low pressure is used during the pre-bake to draw the outgassed dopants away from the wafer surface and out of the reactor to exhaust. A thin epitaxial layer may next be deposited to cap the buried layer followed by a flush step to reduce the dopant concentration in the reactor after the dopant source has been capped. The temperature may then be further lowered (to minimize diffusion of the buried collector) to deposit the remaining portion of the epitaxial layer. The high temperatures involved in order to minimize autodoping cause significant amounts to outgas from the buried layers. Thus, the buried layers must be more heavily doped initially to compensate for the loss during the epitaxial pre-bake steps. This, in turn, allows more diffusion of the buried layer in the substrate consequently increasing collector-substrate capacitance and also requires higher temperature anneals to remove implant damage. A method that further reduces the amount of updiffusion and lateral autodoping is needed.

SUMMARY OF THE INVENTION

A method for controlling the autodoping during epitaxial silicon deposition is disclosed herein. First, a substrate having buried layers and an oxide-free or nearly oxide-free surface is provided to an epitaxial deposition chamber. A lower temperature capping layer (500–850° C.) is deposited to prevent autodoping. Then, the temperature is increased to the desired deposition temperature and the remainder of the epitaxial layer is deposited.

An advantage of the invention is providing a method of forming an epitaxial layer having reduced lateral and vertical autodoping.

A further advantage of the invention is providing a method for depositing an epitaxial layer having a reduced cycle time.

A further advantage of the invention is providing a method for depositing an epitaxial layer that maintains abrupt dopant junction between the epitaxial layer and doped buried regions.

These and other advantages will be apparent to those skilled in the art having reference to the specification in conjunction with the drawings and claims.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
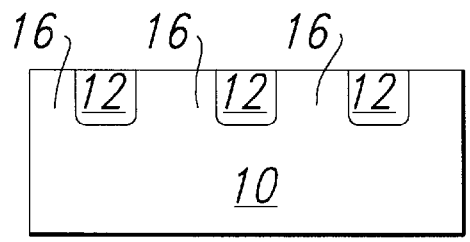
FIG. 1 is a cross-sectional diagram of a substrate having buried doped regions onto which an epitaxial layer (or epitaxial silicon film) according to the invention is to be formed.

The invention will now be described in conjunction with forming an epitaxial layer on a substrate comprising buried regions doped with arsenic for devices such as bipolar and BiCMOS devices. A substrate 10 comprising such buried regions 12 is shown in FIG. 1.

First, substrate 10 is cleaned to remove any native oxide or other contaminants from the substrate 10 surface. The cleaning process chosen should be one that not only removes any native oxide from the surface but also inhibits the regrowth of oxide while the wafer remains within the cleaning process chamber. For example, a hydrofluoric (HF) acid clean or a HF vapor clean may be used without a water rinse. Other cleaning processes capable of providing an oxide-free or nearly oxide-free (e.g., less than a monolayer of oxide) surface will become apparent to those skilled in the art. If the same chamber is not used for both the cleaning and deposition steps, the wafer is then transferred from the cleaning process chamber to an epitaxial deposition chamber in an inert or vacuum ambient. Using an inert or vacuum ambient inhibits that regrowth of an oxide layer on the surface of substrate 10. Thus, a high temperature pre-bake to remove the oxide is unnecessary and the associated substantial outgassing of dopants from buried regions 12 is avoided. In addition, the time required to heat the chamber to the high temperatures on the order of 1200° C. and subsequent flushing of evaporated dopants is avoided. Preferably, the cleaning chamber and deposition chamber are part of a single cluster tool.

Once inside the epitaxial deposition chamber, the substrate 10 is heated to a temperature in the range of 500–850°C. In the preferred embodiment, a temperature on the order of 825° C. is used. A low temperature bake may be desired at this point for a duration on the order of 60 seconds. Preferably, however, the above cleaning and transfer steps were sufficient to prevent the regrowth of any oxide on the surface of substrate 10. If no oxide or surface contaminants are present, it is preferable to skip the low temperature bake step.

Figure 2:
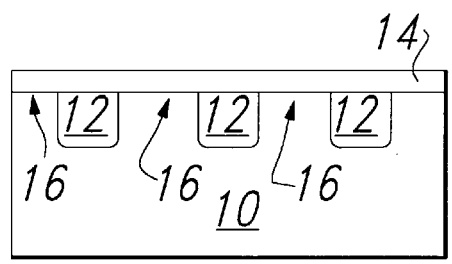
FIGS. 2–3 are cross-sectional diagrams of the epitaxial deposition process according to the invention.

Maintaining the above temperature in the process chamber, a thin silicon capping epitaxial layer 14 is grown on the surface of the substrate by, for example, using a source gas selected from the group consisting of dichlorosilane, trichlorsilane, silicon tetrachloride, silane and disilane as shown in FIG. 2. Because lower temperatures are used than in prior art techniques, less dopants updiffuse into the capping layer 14 or evaporate and laterally autodope the surrounding substrate regions 16. A low temperature capping layer was undesirable in prior art methods because of the high temperature pre-bake that released substantial amounts of dopants into the chamber and on the substrate surface. As discussed above, lower temperatures increase the tendency of the arsenic atoms to stick to the surface of the substrate. Because the high temperature pre-bake is avoided, substantial amounts of dopant do not evaporate from the buried layer and thus, the amount of lateral autodoping on substrate surface areas 16 is reduced in spite of the lower temperature of the thin epitaxial layer deposition. Thin epitaxial capping layer 14 is preferably on the order of 0.1 micron thick (0.05 to 0.3 microns). The desired thickness is determined by the length of time ($\Delta t$) between the end of the formation of the thin epitaxial layer 14 and the start of the primary epitaxial deposition step forming epitaxial layer 18 and extent to which the dopant updiffuses from the substrate during that time. As $\Delta t$ increases, the desired thickness of the epitaxial capping layer 14 also increases to prevent dopants from updiffusing through the epitaxial capping layer 14 and into the chamber.

Figure 3:
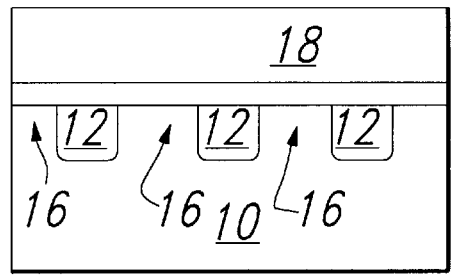

The temperature of the epitaxial deposition chamber is then raised to the desired temperature for depositing the remainder of the epitaxial layer 18. For example, temperatures in the range of 1000–1150° C. may be used. In the preferred embodiment a temperature on the order of 1100° C. is used. The temperature is selected based on desired deposition rate (cycle time), pattern distortion, allowable updiffusion, and other considerations. Once the desired temperature has been reached, epitaxial layer 18 is deposited as shown in FIG. 3. The deposition source gas in the preferred embodiment is dichlorosilane. However, other source gases may alternatively be used such as trichlorosilane, silicon tetrachloride, silane, or disilane. The thickness of epitaxial layer 18 is typically on the order of 1 micron. However, the thickness of epitaxial layer 18 may vary. The duration of the deposition may vary depending on the thickness desired, the deposition temperature, and the deposition rate. As an example only, for a temperature on the order of 1100° C., a thickness on the order of 1.0 micron, and a deposition rate of 0.2 $\mu$m/min., a duration on the order of 265 seconds is appropriate. Of course, higher deposition rates may be used.

The above described process flow requires approximately 50% less time to complete than prior art methods. This is primarily due to the time required, in prior art methods, to heat the chamber to the required temperatures for the high temperature pre-bake and cooling back to deposition temperature. As the push for increased production levels and reduced production time continues, this time factor becomes increasingly important.

Figure 4:
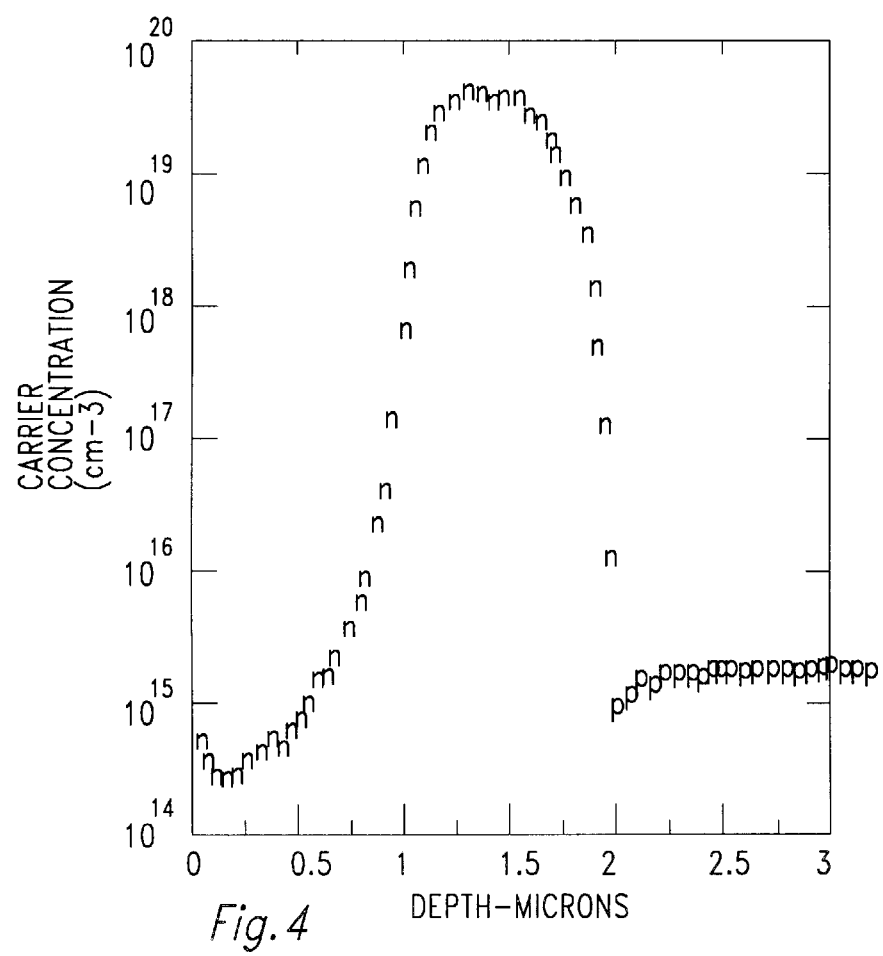
FIG. 4 is a graph of dopant concentration versus depth of a prior art epitaxial deposition method through a buried doped region.
Figure 5:
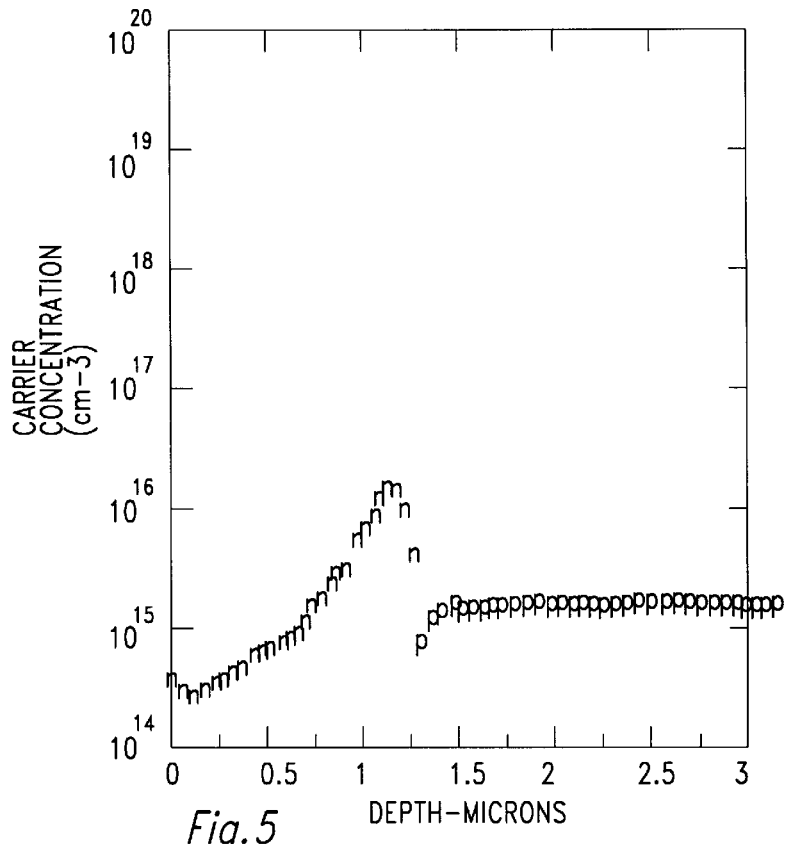
FIG. 5 is a graph of dopant concentration versus depth of a prior art epitaxial deposition method adjacent a buried doped region.

FIGS. 4 and 5 are graphs of dopant concentration versus depth from the surface for a prior art method of forming an epitaxial layer over a substrate having buried regions. The process is a 1200° C. bake for 2 minutes at a pressure of 6 torr followed by a 1150° C. deposit of a sealing layer for 30 seconds and a primary epitaxial deposit at 1030° C. The epitaxial layer is formed to approximately 1.0 micron in depth. The region greater than 1.0 micron in depth is the substrate and buried region if present. FIG. 4 illustrates the dopant concentration at a place in the substrate where a doped buried region is formed and FIG. 5 illustrate the dopant concentration at a place in the substrate where there is no buried region. Referring to FIG. 5, line 24 illustrates the lateral autodoping from a buried doped region such as region 12 of FIG. 1 to the adjacent region such as region 16 of FIG. 1. As can be seen from line 24, the peak lateral autodoping concentration is approximately 1.5E16.

Figure 6:
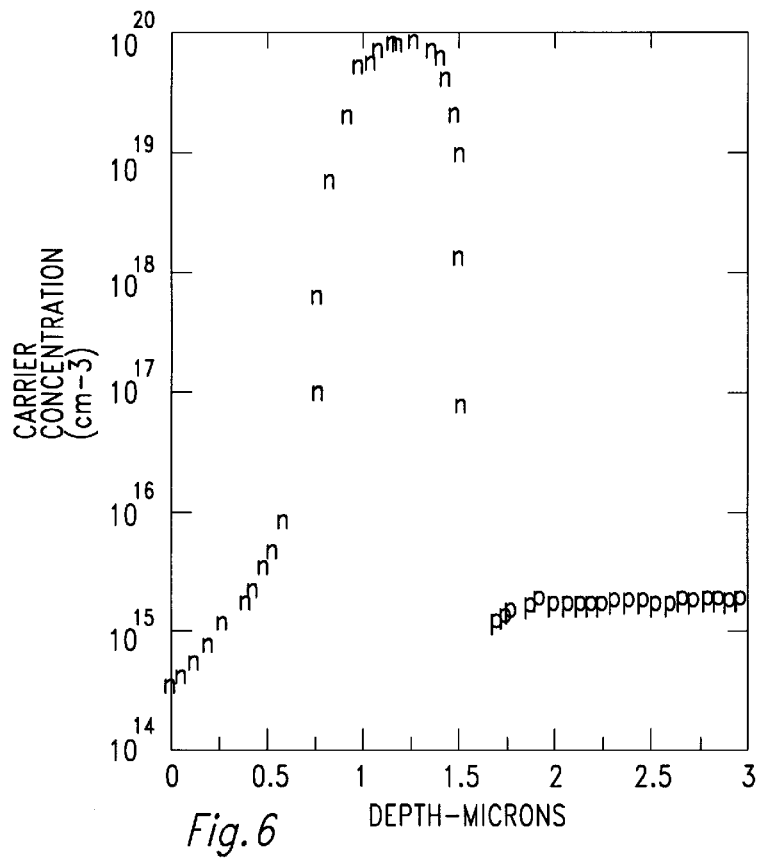
FIG. 6 is a graph of dopant concentration versus depth of an epitaxial deposition method according to the invention without the optional pre-bake through a buried doped region.
Figure 7:
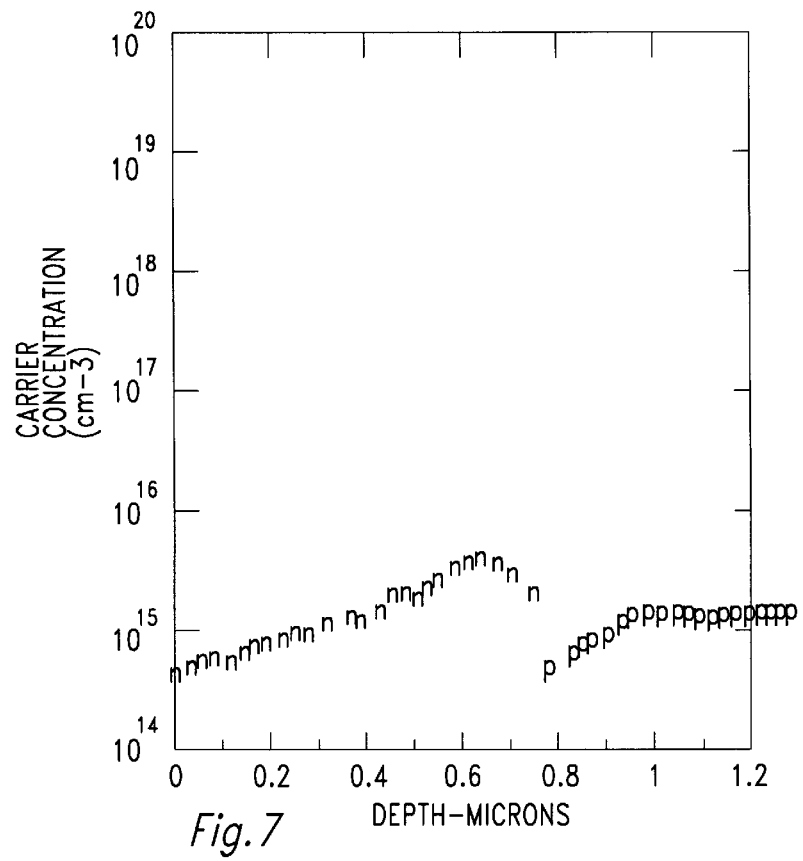
FIG. 7 is a graph of dopant concentration versus depth of an epitaxial deposition method according to the invention without the optional pre-bake adjacent a buried doped region.
Figure 8:
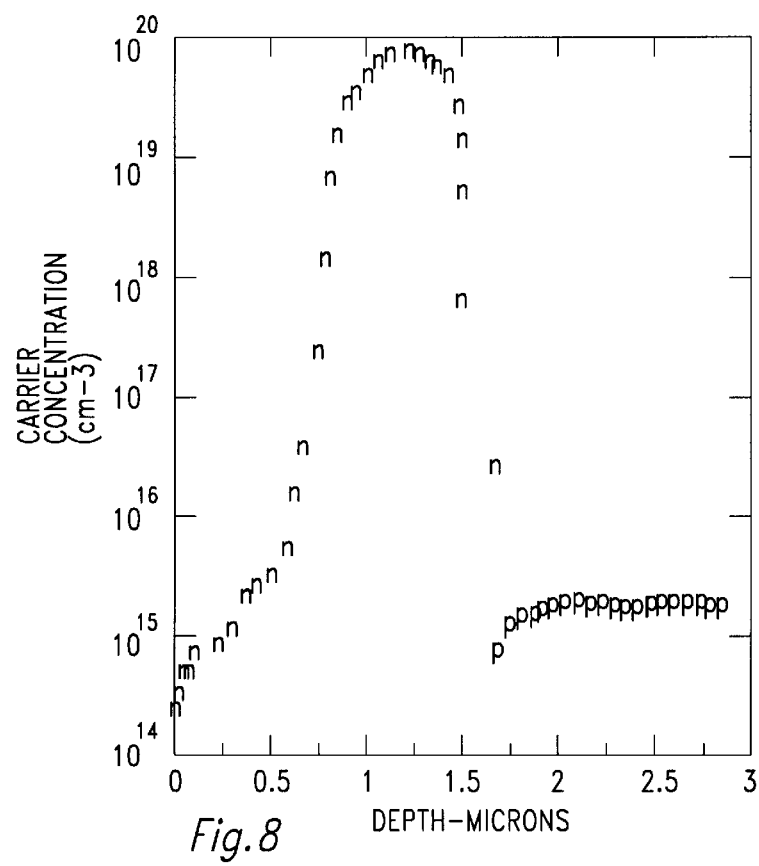
FIG. 8 is a graph of dopant concentration versus depth of an epitaxial deposition method according to the invention with the optional pre-bake through a buried doped region.
Figure 9:
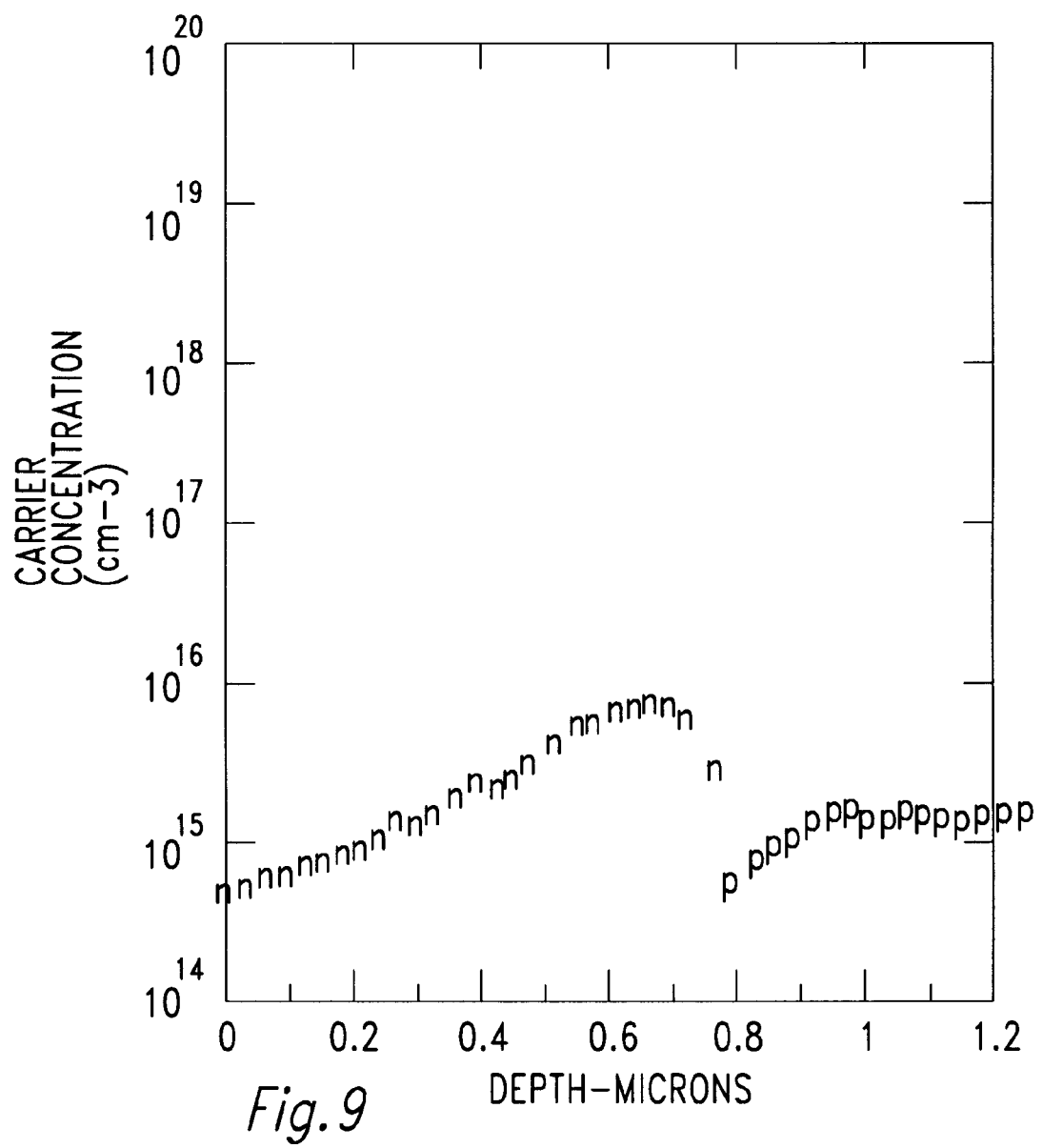
FIG. 9 is a graph of dopant concentration versus depth of an epitaxial deposition method according to the invention with the optional pre-bake adjacent a buried doped region.

FIGS. 6 and 7 illustrate graphs of dopant concentration versus depth for the method according to the preferred embodiment of the invention without the optional low-temperature pre-bake. FIGS. 8 and 9 illustrate the preferred embodiment with the optional pre-bake. Comparing FIGS. 6 and 8 to FIG. 4, it can be seen that the peak concentration of the buried regions is higher and the width of the buried layer profile is narrower for the methods according to the invention. This indicates that less of the original doping of the buried regions has outgassed and diffused in the methods according to the invention. Referring to FIGS. 7 and 9, the amount of lateral autodoping is reduced from that of the prior art. The peak lateral autodoping of FIG. 7 is 3E15 versus 1.5E16 of the prior art. The peak lateral autodoping of FIG. 8 is approximately 5.5E15. Thus, it can be seen that both methods according to the invention (i.e. with and without the low temperature pre-bake) significantly reduce the amount of lateral autodoping.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming an epitaxial layer on a substrate with minimal autodoping from doped regions formed therein, comprising the steps of:

providing a cleaned surface on said substrate having doped regions to an epitaxial deposition chamber;

epitaxially forming a capping layer comprising silicon on said substrate;

increasing a temperature in said deposition chamber to a temperature in the range of 1000° C.–1150° C.; and depositing a remainder of said epitaxial layer.

2. The method of claim 1, further comprising the step of heating said deposition chamber to a temperature in the range of 500–850° C. prior to said step of epitaxially forming said capping layer.

3. The method of claim 1, wherein said providing step comprises the step of transferring said substrate to said epitaxial deposition chamber in an inert ambient.

4. The method of claim 1, wherein said providing step comprises the step of transferring said substrate to said epitaxial deposition chamber in a vacuum ambient.

5. The method of claim 1 further comprising the step of baking said substrate in said deposition chamber prior to said step of epitaxially forming said capping layer at a temperature in the range of 500–850° C.

6. The method of claim 5, wherein said baking step occurs for a duration on the order of 60 seconds.

7. The method of claim 1, wherein said capping layer has a thickness on the order of 0.1 micron.

8. The method of claim 1 wherein said providing step comprises the step of cleaning said surface of said substrate using a HF vapor clean.

9. The method of claim 8, wherein said cleaning step uses a cleaning process chamber and said cleaning process chamber and said epitaxial deposition chamber are part of a single cluster tool.

10. The method of claim 8, wherein said cleaning step occurs in said epitaxial deposition chamber.

11. A method for forming an epitaxial layer on a substrate having minimal autodoping from doped regions formed therein, comprising the steps of:

cleaning a surface of said substrate in a cleaning chamber to remove any oxide thereon;

transferring said substrate from said cleaning chamber to a deposition chamber without exposing said substrate to oxygen;

heating said deposition chamber to a temperature in the range of 500–850° C.;

epitaxially forming a capping layer comprising silicon on said substrate;

increasing a temperature in said deposition chamber to a temperature in the range of 1000° C.–1150° C.; and depositing a remainder of said expitaxial layer.

12. The method of claim 11, wherein said transferring step takes place in an inert ambient.

13. The method of claim 11, wherein said transferring step takes place in a vacuum ambient.

14. The method of claim 11, further comprising the step of baking said substrate in said deposition chamber prior to said step of epitaxially forming said capping layer at a temperature in the range of 500–850° C.

15. The method of claim 14, wherein said baking step occurs for a duration on the order of 60 seconds.

16. The method of claim 11, wherein said capping layer has a thickness on the order of 0.1 micron.

17. The method of claim 11, wherein said cleaning chamber and deposition chamber are part of a single cluster tool.

18. The method of claim 11, wherein said epitaxially forming and depositing a remainder steps use a source gas selected from the group consisting of dichlorosilane, trichlorosilane, silicon tetrachloride, silane and disilane.

* * * * *

UNITED STATES PATENT AND TRADEMARK OFFICE
CERTIFICATE OF CORRECTION

PATENT NO. : 6,007,624  
DATED : December 28, 1999  
INVENTOR(S) : Rick L. Wise

Page 1 of 1

It is certified that error appears in the above-identified patent and that said Letters Patent is hereby corrected as shown below:

<u>Title page,</u>
Please insert the following after "Related U.S. Applications Data":

Provisional Application No. 60/003,072 filed 08/31/1995.

Signed and Sealed this

Twenty-fifth Day of December, 2001

Attest:

Attesting Officer

JAMES E. ROGAN  
*Director of the United States Patent and Trademark Office*